United States Patent
Dell et al.

(10) Patent No.: US 8,516,408 B2
(45) Date of Patent: Aug. 20, 2013

(54) OPTIMIZATION OF CIRCUITS HAVING REPEATABLE CIRCUIT INSTANCES

(75) Inventors: Richard Bruce Dell, Allentown, PA (US); Ross A. Kohler, Allentown, PA (US); Richard J. McPartland, Nazareth, PA (US); Wayne E. Werner, Coopersburg, PA (US)

(73) Assignee: LSI Corporation, San Jose, CA (US)

( * ) Notice: Subject to any disclaimer, the term of this patent is extended or adjusted under 35 U.S.C. 154(b) by 713 days.

(21) Appl. No.: 12/471,968

(22) Filed: May 26, 2009

(65) Prior Publication Data
US 2010/0301926 A1    Dec. 2, 2010

(51) Int. Cl.
*G06F 17/50* (2006.01)

(52) U.S. Cl.
USPC .......... 716/56; 716/54; 716/55; 716/108; 716/113; 716/134; 430/5; 430/30

(58) Field of Classification Search
USPC ......... 716/50–56, 108–113, 132–135; 430/5, 430/30
See application file for complete search history.

(56) References Cited

U.S. PATENT DOCUMENTS

| | | | |
|---|---|---|---|
| 5,847,969 A | 12/1998 | Miller et al. | |
| 6,385,079 B1 | 5/2002 | Tran | |
| 7,020,022 B1 | 3/2006 | Wang et al. | |
| 7,305,640 B1 | 12/2007 | Phoon et al. | |
| 2002/0110042 A1* | 8/2002 | Dubey | 365/233 |
| 2007/0044049 A1* | 2/2007 | Adams et al. | 716/4 |
| 2007/0279992 A1* | 12/2007 | Cernea et al. | 365/185.21 |
| 2008/0001795 A1* | 1/2008 | Arabi et al. | 341/107 |
| 2008/0104566 A1 | 5/2008 | Avss et al. | |
| 2008/0225620 A1* | 9/2008 | Masumizu et al. | 365/225.7 |
| 2010/0131259 A1* | 5/2010 | Joshi et al. | 703/14 |
| 2010/0287335 A1* | 11/2010 | Chung et al. | 711/103 |

FOREIGN PATENT DOCUMENTS
KR    10-0897298    *    5/2009

* cited by examiner

*Primary Examiner* — Nha Nguyen
(74) *Attorney, Agent, or Firm* — Ryan, Mason & Lewis, LLP

(57) ABSTRACT

Techniques for forming a first electronic circuit including a plurality of instances of a repeatable circuit element include the steps of: obtaining a total number of instances of the repeatable circuit element in a design of an IC including the first electronic circuit and at least a second electronic circuit; and configuring at least one functional parameter of the first electronic circuit as a function of the total number of instances of the repeatable circuit element in the IC to thereby satisfy a prescribed minimum composite manufacturing yield of the IC and/or at least one specification of the IC under prescribed operating conditions.

30 Claims, 3 Drawing Sheets

300

OPTIMIZATION OF CIRCUITS HAVING REPEATABLE CIRCUIT INSTANCES

FIELD OF THE INVENTION

The present invention relates generally to the electrical, electronic, and computer arts, and more particularly relates to circuits having repeatable circuit instances.

BACKGROUND OF THE INVENTION

Most embedded memory used in modern integrated circuits (ICs) is predominantly compiled memory. Typically, in ICs comprising a large total amount of memory, the memory is distributed over many memory instances. The term "memory instance" may be defined as an independently functioning memory circuit that can be repeatedly placed and connected in an IC design in a manner consistent with a logic cell in a standard cell library. Often, a larger memory is formed using multiple smaller memory instances, such as, for example, 200 megabits (Mb) or more of memory distributed over tens to hundreds of memory instances.

When memory instances in a conventional IC are compiled, each memory instance is compiled without consideration of the total amount of memory in the IC. The composite yield for all memory in the IC is a function of the total amount of memory in the IC (i.e., the total number of bits in the IC). Since composite IC yield is generally a product of the individual yield of each of the respective memory instances and related circuitry, the larger the number of memory instances in the IC, the lower the composite IC yield. Thus, while individual memory instances may be designed to have a yield high enough to meet prescribed performance specifications, overall IC yield may fall below an acceptable value due, at least in part, to the large number of memory instances, the total number of memory cells and/or the total number of other memory circuits in the IC, which is undesirable.

SUMMARY OF THE INVENTION

Illustrative embodiments of the present invention provide methods and apparatus for optimizing a trade-off between IC manufacturing yield and performance (e.g., speed, power, etc.) of compiled memory. Embodiments of the invention provide, for example, techniques for more optimally designing a memory instance by taking into consideration the total number of memory instances, or related circuitry, within the IC comprising the memory instance. In this manner, individual memory instances in the IC can be beneficially designed so that the composite yield of the IC and/or one or more functional characteristics of the IC meet prescribed specifications without significantly compromising the performance of the individual memory instances.

In accordance with an aspect of the present invention, a method for forming a first electronic circuit including a plurality of instances of a repeatable circuit element include the steps of: obtaining a total number of instances of the repeatable circuit element in a design of an IC including the first electronic circuit and at least a second electronic circuit; and configuring at least one functional parameter of the first electronic circuit as a function of the total number of instances of the repeatable circuit element in the IC to thereby satisfy a prescribed minimum composite manufacturing yield of the IC and/or at least one specification of the IC under prescribed operating conditions. The method may be implemented in an article of manufacture.

In accordance with another aspect of the invention, an apparatus is adapted to form a first electronic circuit including a plurality of instances of a repeatable circuit element. The apparatus includes memory and at least one processor coupled to the memory. The processor is operative: (i) to receive a total number of instances of the repeatable circuit element in a design of an integrated circuit including the first electronic circuit and at least a second electronic circuit; and (ii) to configure at least one functional parameter of the first electronic circuit as a function of the total number of instances of the repeatable circuit element in the design of the integrated circuit to thereby satisfy at least a prescribed minimum composite manufacturing yield of the integrated circuit and/or at least one specification of the integrated circuit under prescribed operating conditions.

In accordance with yet another aspect of the present invention, an IC comprises a plurality of electronic circuits and a control circuit coupled to the electronic circuits. Each of the electronic circuits includes one or more instances of a repeatable circuit element. The control circuit is operative to control at least one functional parameter of at least a subset of the plurality of electronic circuits as a function of at least a total number of instances of the repeatable circuit element in the integrated circuit, an interaction of the plurality of instances of the repeatable circuit element with one another, and/or a manner in which the plurality of instances of the repeatable circuit element are utilized in the integrated circuit.

Advantages of the invention include, but are not limited to, optimizing overall or composite yield of an IC including a plurality of circuit instances by considering, while forming or designing the IC, a total number of circuit instances within the IC. For ICs with a large amount of memory circuits distributed across a plurality of memory circuit instances, for example, IC yield can be significantly improved compared to memory circuits compiled, designed or formed using standard approaches.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals indicate similar elements throughout the several views of the drawings, and wherein.

Figure 1:
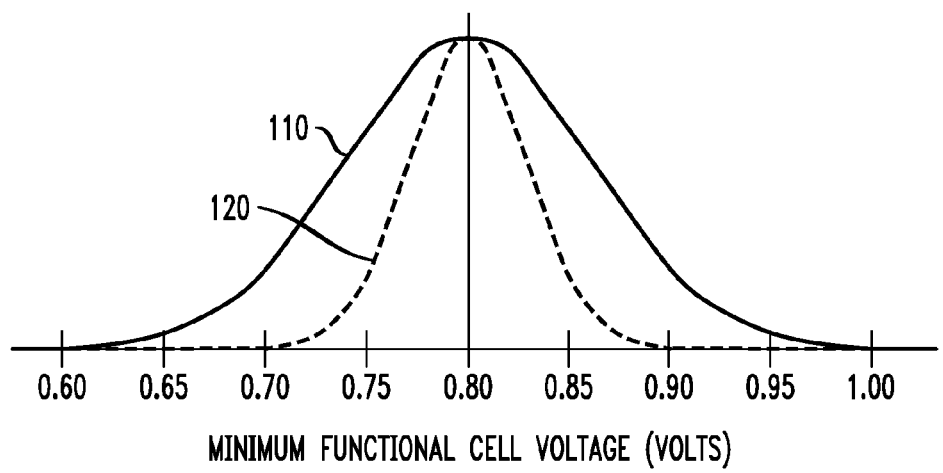
FIG. 1 is a graph illustrating exemplary distributions indicating minimum functional voltage for two groups of memory cells in a memory array, each of the groups comprising different numbers of memory cells.

It is to be appreciated that elements in the figures are illustrated for simplicity and clarity and have not necessarily been drawn to scale. Also, common but well-understood elements that may be useful or necessary in a commercially feasible embodiment may not be shown in order to facilitate a less obstructed view of the illustrated embodiments.

DETAILED DESCRIPTION OF THE INVENTION

The present invention will be described herein in the context of illustrative memory circuits and a method for forming a memory circuit. It is to be appreciated, however, that the techniques of the present invention are not limited to the specific circuits and method shown and described herein. Rather, embodiments of the invention are directed broadly to techniques for improving IC manufacturing yield by optimizing a repeatable circuit instance used in an IC design to take into account the number of circuit instances in the IC. For this reason, numerous modifications can be made to the embodiments shown that are within the scope of the present invention. Moreover, although preferred embodiments of the invention are preferably fabricated in a silicon wafer, embodiments of the invention can alternatively be fabricated in wafers comprising other materials, including but not limited to Gallium Arsenide (GaAs), Indium Phosphide (InP), etc. No limitations with respect to the specific embodiments described herein are intended or should be inferred.

The term "memory circuit," as used herein, is intended to broadly refer to circuitry comprising a plurality of memory cells, preferably organized into a memory array, and other circuitry necessary for accessing and operating the memory array (e.g., column and row circuitry, sense amplifiers, address decoders, pre-charge circuitry, memory controllers, etc.), so that addressed memory locations within the memory array can be selectively accessed (e.g., read from and, for writable memory, written to). A memory circuit may be comprised of a plurality of circuit instances. The term "circuit instance" as used herein is intended to broadly refer to any individual, repeatable, and functionally independent circuit. By way of illustration, a memory circuit may comprise a plurality of memory instances (i.e., individual, repeatable, and functionally independent memory blocks), a plurality of pre-charge circuit instances (i.e., individual, repeatable, and functionally independent pre-charge circuits), sense amplifier instances (i.e., individual, repeatable, and functionally independent sense amplifiers), etc.

Memory circuits embedded within an IC may be of various types, including, for example, dynamic random access memory (DRAM), static random access memory (SRAM), read only memory (ROM), and other non-volatile memories such as flash memory, phase-change memory (PCM), one-time-programmable (OTP) memory, and few-time-programmable (FTP) memory. The present invention is not limited to any particular type of memory employed.

Manufacturing yield is generally defined as a percentage of good products to the total number of products in a production batch. In the case of semiconductor manufacturing, an IC that is deemed "good" is generally indicative of the IC functioning in accordance with prescribed specifications under a given set of operating conditions (e.g., supply voltage, temperature, etc.). Composite yield associated with ICs is a product of the yield of individual subcomponents therein, including, for example, memory instances. If only one of the components in an IC affecting operation of the IC fails, or otherwise does not meet prescribed specifications, generally the entire IC is considered to have failed. Ideally, IC yield is one hundred percent, although in practice one hundred percent yield is rarely attainable due primarily to variations and/or defects that may occur among or within the ICs of a given production batch. This is particularly true of ICs comprising embedded memory having a large number of memory instances therein.

Statistically, the larger the number of memory instances there are within a memory circuit, the wider the variations and the greater the number of defective instances there are in the IC. Variations and/or defects in the memory instances may result in, for example, some memory cells taking longer to access (e.g., read or write), or requiring higher voltage or power to read or write. Unfortunately, conventional memory compiler methodologies do not optimize compiled memory to obtain the highest composite memory yield, and therefore the highest IC yield, by taking into consideration the total number of memory instances within the IC.

By way of illustration only and without loss of generality, assume that the minimum composite yield for a given production batch of ICs is 80 percent and that a memory instance in a given IC is designed to have a yield of about 95 percent (0.95). If there are 10 memory instances in the IC, the composite IC yield is expected to be about 60 percent ($(0.95)^{10}$), which is well below the prescribed minimum yield. According to techniques of the invention, each memory instance is designed to optimize composite yield, at least to a first order, according to the following expression:

$$Yield_{instance} = (Yield_{min})^{\frac{1}{n}},$$

where $Yield_{instance}$ is the individual yield of a given circuit instance, $Yield_{min}$ is the prescribed minimum composite yield of ICs comprising one or more of the circuit instances, and n is the total number of circuit instances in the IC.

Thus, as a function of the total number of memory instances (e.g., 10) in the IC and the minimum acceptable composite yield (e.g., 80 percent), at least one functional parameter of the individual memory instances can be advantageously configured to have a minimum yield of about 97.8 percent (e.g., $(0.80)^{1/10}$) and still meet the prescribed minimum composite yield. The memory instance can be further optimized by taking into consideration other characteristics of the memory circuit, such as, for example, interaction of the plurality of memory instances with one another and/or the manner in which the memory instances are utilized (e.g., application) in the memory circuit. Accordingly, a trade-off between performance and yield for the individual memory instances is optimized to meet (or at least be within an acceptable range of) prescribed minimum composite yield requirements or other prescribed specifications of the IC without significantly degrading performance of the individual memory instances.

Optimizing an individual memory instance typically involves a trade-off between yield, chip area, power consumption and/or performance (e.g., speed), among other characteristics, of the memory instance. Traditional approaches for optimizing individual memory instances are done without consideration for the number of memory instances in the IC, or alternative considerations, such as, for example, the manner in which memory instances interact with one another and/or are employed in the IC. Optimizing the IC comprising one or more memory instances generally entails trade-offs between composite yield, area, power consumption and/or performance, among other characteristics, of the IC. Consequently, embodiments of the invention provide techniques for beneficially improving IC manufacturing yield by optimizing a repeatable circuit instance used in an IC design to take into account the number of circuit instances in the IC and/or alternative characteristics, such as, for example, interaction of circuit instances with one another. For example, optimization of at least one memory instance within a memory circuit in an IC is advantageously provided so that, in conjunction with other circuits in the IC, a prescribed power limit for the IC is not exceeded.

Consider memory cells and sense amplifiers, two circuits that are prone to failure and are replicated many times within a memory circuit. Without taking into account memory repair and/or error correction methodologies, substantially all functional subcomponents in the memory circuit (e.g., memory cells, sense amplifiers, etc.) must be good; that is, all the memory circuit subcomponents must function in accordance with prescribed specifications in order for the IC to be deemed fully functional (i.e., "good").

Consider, for instance, a characteristic of memory cells that involves functionality, such as, for example, minimum functional voltage of a memory cell. With reference to FIG. 1, a graph 100 illustrates exemplary distributions representing minimum functional voltage for two groups of memory cells in a memory array, each of the groups comprising a different number of memory cells relative to one another. The two groups of memory cells preferably comprise identically designed memory cells that are formed using the same IC fabrication process. A first (wider) distribution 110 represents a first group of memory cells, and a second (narrower) distribution 120 represents a second group of memory cells, the first group of memory cells being greater in number than the second group of memory cells. By way of example only, as apparent from the figure, the second group of memory cells represented by the second distribution 120 are all functional using a voltage of about 0.9 volt or greater, while the first group of memory cells represented by the first distribution 110 needs about 1.0 volt or more in order for all memory cells therein to be functional. Although only two distributions are shown, it is to be understood that more than two distributions of memory cells may be created.

A memory circuit comprises other circuit instances in addition to memory cells. For example, a memory circuit typically comprises row and column circuits (each of which may include address decoders, etc.), sense amplifiers and a precharge circuit coupled to an array of memory cells. The column circuits, sense amplifiers, and precharge circuit may be represented by similar distributions. Generally, the larger the number of circuit instances (e.g., memory cells, sense amplifiers, and/or column circuits) in an IC, the higher the minimum voltage required for functionality of the IC. Memory repair (e.g., redundant memory cell replacement) and/or error correction methodologies will often improve yield, but the same argument remains after some memory cells, sense amplifiers, and/or column circuits have been repaired and/or error corrected. Repair and/or error correction is limited in the number of cells, sense amplifiers and/or column circuits that can be replaced and/or corrected. Moreover, memory repair and/or error correction methodologies have disadvantages in that they require additional circuitry and related processing overhead, which undesirably increases the size and complexity of the memory circuit.

Besides a distribution representing minimum functional cell voltage in a memory circuit, as shown in FIG. 1, another distribution which can be compiled is a distribution of delay times associated with a memory element. One example is a distribution of delay time of a signal through different instances of the same circuit element. Another illustrative distribution may represent delay time required for correct functioning of all instances of a given memory element, such as, for example, a distribution of delay time required for correct signal development from all memory cells through corresponding coupled sense amplifiers. The delay time required for correct signal development may be defined from the time when a row circuit activates a corresponding memory cell for reading to when read data corresponding to the memory cell is presented on the sense amplifier output. Numerous other distributions can be generated, as will be understood by those skilled in the art.

The term "circuit element" as used herein is intended to broadly refer to a component within a circuit, wherein a given circuit may comprise a plurality of instances of the circuit element. More specifically, the term "memory element" as used herein is intended to refer to a component (e.g., memory cell) within a memory circuit, wherein the memory circuit may comprise many instances of the memory element. By design, it is intended that all copies of the memory element in the memory circuit be identical. In reality, however, variations in the manufacturing process cause differences between copies of memory elements that, by design, are intended to be identical. Variations between memory elements may arise, for example, in component feature dimensions, component feature shape, impurity implant dose and impurity implant distribution, etc. Specific examples of variations in field-effect transistors (FETs) within memory elements include variations in insulator thickness (e.g., gate oxide thickness), channel length, channel width, channel doping, source doping and drain doping. Memory elements may include, for example, a memory cell, a sense amplifier, a column circuit, a precharge circuit, a row driver, an output buffer, or a combination of one or more memory elements (e.g., a column circuit with coupled sense amplifier and/or precharge circuit). Statistically, the larger the number of copies of a memory element, within an IC, the more opportunity there is for variations and the larger the spread in distributions, such as the minimum functional cell voltage distribution shown in FIG. 1.

Memory compilers may be implemented as software programs executed on a computer or other processing system, although hardware and firmware memory compilers or memory compilers comprising a combination of hardware, software and/or firmware are similarly contemplated by the present invention. Memory compilers provide artifacts for manufacturing a memory circuit within an IC. One illustrative artifact may include memory circuit information expressed as, for example, a net list or a schematic diagram, which describe the connectivity of an electronic design. Another illustrative artifact may comprise physical layout information necessary to fabricate the memory circuit. Graphic Data System (GDS) and GDSII (owned by Cadence Design Systems, Inc.) are binary file formats representing planar geometric shapes, text labels, and other information describing the physical layout of an IC in hierarchical form. GDSII data can be used to reconstruct all or a portion of the artwork to be used in sharing layouts, transferring artwork between different tools, or creating photomasks used in fabricating an IC.

As previously stated, aspects of the present invention beneficially provide techniques for improving composite IC manufacturing yield by optimizing a repeatable circuit instance (e.g., memory cell) used in an IC design (e.g., memory circuit) to take into account the number of circuit instances in the IC and/or alternative considerations, such as, for example, the manner in which at least a portion of the circuit instances interact with one another and/or are employed in the IC.

Figure 2:
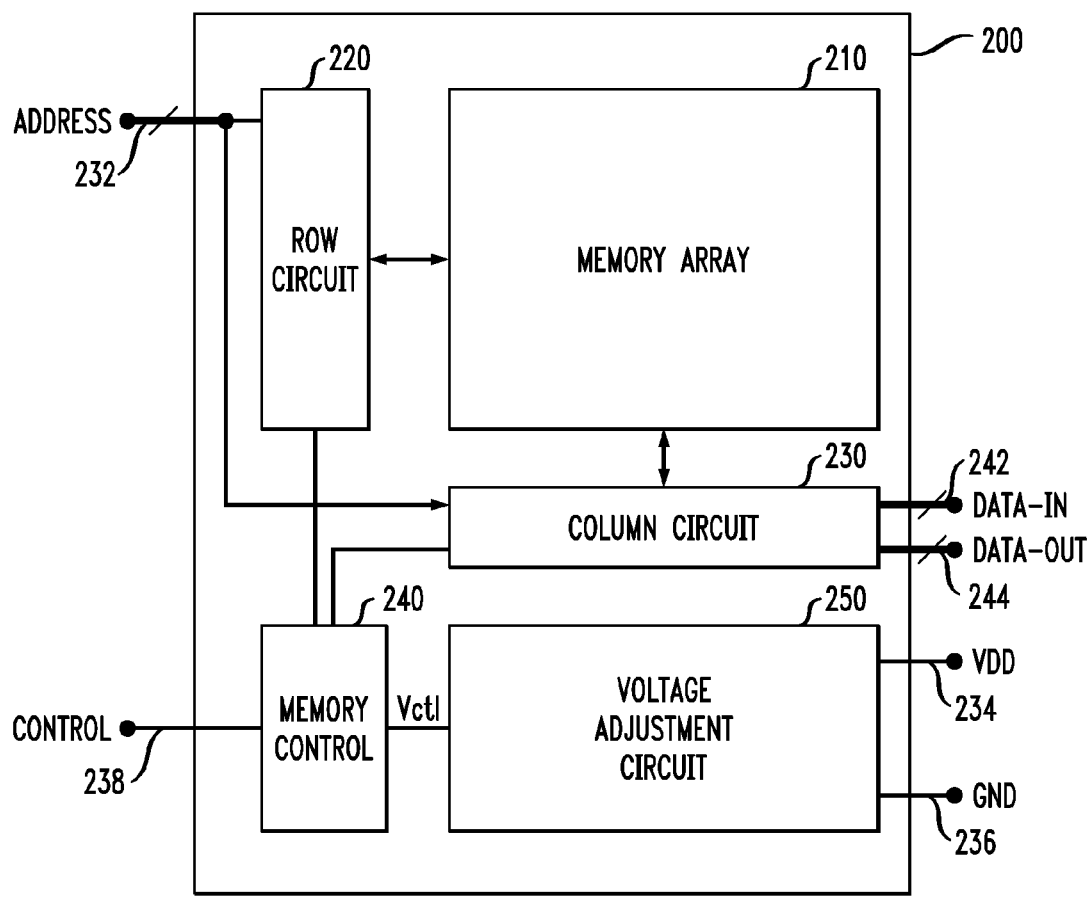
FIG. 2 is a block diagram depicting at least a portion of an exemplary memory circuit, according to an embodiment of the present invention.

FIG. 2 is a block diagram depicting at least a portion of an exemplary memory circuit 200, formed in accordance with an embodiment of the present invention. Memory circuit 200 comprises a memory array 210, which includes a plurality of memory cells therein, and on-pitch row and column circuits, 220 and 230, respectively, coupled to the memory array for providing selective access to the memory cells as a function of at least a first control signal, which may be an address signal (ADDRESS), supplied to the row and column circuits via an address connection 232. Since address connection 232 may convey more than one address signal, this connection may be a bus connection (e.g., address bus). Memory circuit 200 also includes a first power connection 234 adapted for coupling to a voltage supply of the memory circuit, which may be VDD, and a second power connection 236 adapted for coupling to a voltage return of the memory circuit, which may be ground (GND).

Memory circuit 200 further includes a memory control circuit 240, or an alternative processor, coupled to the row circuit 220 and column circuit 230 for controlling the row and column circuits in response to at least a second control signal (CONTROL) supplied to the memory control circuit via a control connection 238. More particularly, memory control circuit 240 is operative to control functioning of one or more aspects of memory array 210, such as, for example, the functioning of read, write, refresh and precharge cycles, the sequencing of internal memory operations, and the timing of internal memory operations.

Memory array 210 may be implemented in a manner consistent with a standard memory array, although the invention is not limited to any specific memory array configuration. Specifically, although not explicitly shown, memory array 210 preferably includes a plurality of word lines, a plurality of bit lines, and a plurality of memory cells, each memory cell being coupled to a unique pair of word and bit lines and selectively accessed by a unique address. Word lines are typically oriented horizontally, in rows, and are therefore often referred to as row lines, or simply rows. Likewise, bit lines are typically oriented vertically, in columns, and are therefore often referred to as column lines, or simply columns. A first subset of the memory cells are typically coupled to a common row line. Likewise, a second subset of the memory cells, which may include memory cells from the first subset, are typically coupled to a common column line. Although commonly oriented orthogonally to one another, alternative arrangements of the column lines and row lines are contemplated by the invention.

Row circuit 220 preferably comprises row decoders and row drivers (not explicitly shown) adapted for connection to one or more corresponding row (word) lines in the memory array 210. The row decoders are coupled to the address connection 232 and to the row drivers in row circuit 220. Each row driver is coupled to a corresponding row line within the memory array 210. As a function of at least a portion of the address signal, during a memory access, a given one of the row drivers in row circuit 220 will preferably activate the row line that the given row driver is coupled to.

Column circuit 230 preferably comprises column decoders, sense amplifiers and, optionally, column multiplexers, or alternative switching circuitry (not explicitly shown), adapted for connection to one or more corresponding column (bit) lines in the memory array 210. Column circuit 230 is preferably operative to receive input data (DATA-IN), which may be supplied to one or more memory cells in the memory array 210, via a third connection, which may be an input data connection 242 of the memory circuit 200. Column circuit 230 is also preferably operative to generate output data (DATA-OUT), as may be read from one or more memory cells in the memory array 210, via a fourth connection, which may be an output data connection 244 of the memory circuit 200.

Since input data connection 242 and output data connection 244 may convey more than one signal, each of these connections may be bus connections. The number of signals that the input data connection 242 or the output data connection 244 conveys, also referred to as a width of the connection, is generally a function of the arrangement of the memory array 210 (e.g., data path width). It is to be understood that the invention is not limited to any specific width of the input and output data connections 242, 244.

Each sense amplifier in column circuit 230 is coupled to at least one column line and is operative to detect and amplify the data signal stored within a given memory cell coupled to the at least one column line. The column multiplexer, when present, preferably comprises a plurality of inputs coupled to a plurality of corresponding column lines (e.g., eight) and an output coupled to a corresponding sense amplifier. Thus, the column multiplexer allows a single sense amplifier to be coupled to a plurality of column lines in the memory array 210. The column multiplexer is preferably coupled to the address connection 232 and is adapted to select, as a function of at least a first portion of the address signal, which column lines are connected to a given sense amplifier during a memory access, only one column being coupled to each sense amplifier at a given time. If the column multiplexer is not present, one column line is connected directly to a corresponding sense amplifier.

The column circuit 230 may further optionally comprise an output selector circuit (not explicitly shown), or alternative switching circuitry, including a plurality of inputs coupled to respective outputs of corresponding sense amplifiers and an output coupled to the output data connection 244. The output selector circuit, when present, preferably selects, as a function of at least a second portion of the address signal, which sense amplifier to couple to the output data connection 244.

Memory circuit 200 preferably includes a memory control circuit 240, or an alternative processor, coupled to the row circuit 220 and column circuit 230 for controlling the row and column circuits in response to at least a second control signal (CONTROL) supplied to the memory control circuit via a control connection 238. More particularly, memory control circuit 240 is operative to control functioning of one or more aspects of memory array 210, such as, for example, the functioning of read, write, refresh and precharge cycles, the sequencing of internal memory operations (e.g., address decoding), the timing of internal memory operations (e.g., row activation, signal development, etc.), sense amplifier amplification, etc. The control circuit 240 preferably comprises at least one timing circuit adapted to provide timing or a timing delay for internal memory operation. For example, control circuit 240 may control, as a function of the control signal, whether the memory circuit 200 is reading, writing or in a standby mode of operation.

Memory circuit 200 may further comprise a voltage adjustment circuit 250, or alternative programmable voltage source, coupled to the control circuit 240 and to VDD and ground via the first and second power connections 234 and 236, respectively. Voltage adjustment circuit 250 is preferably operative to supply a voltage to at least a portion of the memory circuit 200 for at least a portion of time during which the memory circuit is operated. A level of voltage supplied by the voltage adjustment circuit 250 is preferably selectively controlled as a function of a control signal, Vctl, generated by the control circuit 240. The voltage adjustment circuit 250 may also be coupled to other memory elements within the memory circuit 200, such as, for example, memory array 210, row circuit 220 and column circuit 230.

According to aspects of the invention, voltage adjustment circuit 250 may be operative to generate a plurality of output voltages for supplying a plurality of corresponding memory elements in memory circuit 200 with different voltage levels. Voltage adjustment circuit 250 may comprise a programmable voltage source operative to generate one or more output voltages as a function of control signal Vctl. In this manner, voltage adjustment circuit 250 may be configured to selectively turn off power to one or more memory elements (e.g., memory array 210, row circuit 220, and/or column circuit 230) in the memory circuit 200, thereby beneficially reducing power consumption in the memory circuit.

It is to be understood that, although depicted as independent functional blocks, one or more of the functional blocks in memory circuit 200 may be combined to form another functional block which incorporates at least a portion of the functionalities of the combined blocks. Alternatively, one or more functional blocks may be incorporated into one or more other functional blocks. For example, voltage adjustment circuit 250 may be incorporated into control circuit 240, in accordance with aspects of the invention.

Figure 3:
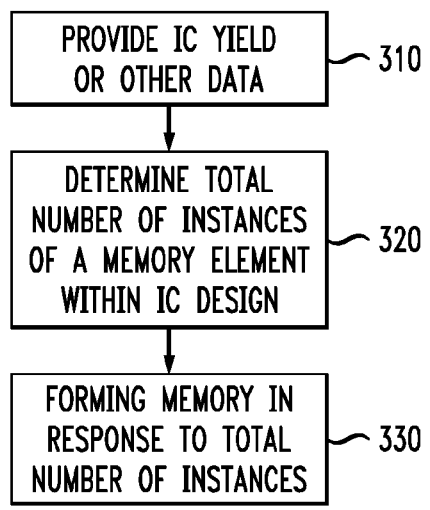
FIG. 3 is a flow diagram depicting an exemplary method of forming a memory circuit, according to an embodiment of the present invention.

FIG. 3 is a flow diagram depicting an exemplary method 300 of forming a memory circuit, according to an embodiment of the present invention. While illustrative method 300 is directed to forming a memory circuit, techniques of the invention are similarly applicable to optimizing composite manufacturing yield in any circuit comprising a plurality of circuit instances, as previously explained.

In step 310, IC yield and/or other data relating to a given IC design is provided to a memory compiler, or alternative circuit compiler. Yield data may include, for example, IC yield as a function of the number of circuit elements within the IC. According to an illustrative embodiment wherein the IC includes a memory circuit, yield data may comprise IC yield as a function of the number of memory cells in the IC. It is to be appreciated that yield data may be presented as a function of more than one characteristic of the IC. The IC comprises at least two circuit instances, with yield data preferably reflecting the total number of circuit elements (e.g., memory cells) within all circuit instances in the IC.

Other data which may be provided to the compiler may include, for example, IC power consumption as a function of the number of circuit elements in the IC. In the case of an IC including a memory circuit, for example, the other data provided to the memory compiler may be a function of a plurality of different memory elements within the IC and the numbers of each of those memory elements.

Yield and other data are preferably compiled prior to step 310. As will become apparent to those skilled in the art, yield and other data provided to the compiler may be obtained from previously manufactured ICs or, alternatively, be projected from data based on previously manufactured ICs. Yield and other data is used by the compiler in order to optimize a compiled circuit (e.g., memory circuit) to provide, among other benefits, optimized IC yield and/or other IC characteristics, such as, but not limited to, power consumption, considering all or most of the circuit instances within the IC.

In step 320, a total number of circuit instances in the IC design is determined or otherwise obtained. For example, in an exemplary IC design comprising a memory circuit, step 320 preferably determines the total number of instances of a memory element included in the IC design (e.g., distributed across multiple memory circuits in the IC), such as, for example, the total number of memory cells in the IC. The total number of instances of the memory element can be obtained from a priori knowledge of a description or alternative representation of the IC design, for example, knowledge of the high-level design, architecture and/or function of the IC (e.g., circuit description language (CDL), Very High Speed Integrated Circuit Hardware Description Language (VHDL), etc.). The invention contemplates that alternative methodologies may be used for determining the total number of instances of the memory element. The IC design preferably comprises multiple memory circuits, each of which includes one or more memory elements.

In step 330, the circuit is formed as a function of the total number of circuit instances therein as determined in step 320. For example, in the illustrative IC design including at least one memory circuit, forming the memory circuit preferably comprises executing a memory compiler to thereby generate memory artefacts. In forming the memory circuit, the compiler considers the yield and/or other data provided thereto in order to optimize the memory circuit for composite IC yield, power consumption and/or other IC characteristics.

In order to optimize yield, power and/or other characteristics associated with an IC design, the compiler may control timing (e.g., delay) in one or more signal paths in the circuit element as a function of the total number of instances of the circuit element in the IC. By way of example only, in order to optimize IC yield, more signal development time may be apportioned for an IC having a greater number of memory cells compared to an IC having fewer memory cells therein.

As another example, in order to optimize power consumption in an IC having a large number of output buffer instances, peak current may be advantageously reduced by increasing signal propagation time through the output buffers and/or reducing rise-time of output signals generated by the output buffers. One way of reducing peak current in an output buffer instance may comprise skewing the timing for a given memory function(s) between two or more different memory circuits in the output buffer instance, so that current pulses from the two or more memory circuits do not superimpose.

For an IC having a large number of memory cells, a more robust memory cell may be required to provide adequate IC yield than would be required for an IC having fewer memory cells. By way of example only, a memory cell consuming less power (e.g., leakage power) may be required for an IC design having a larger number of memory cells than would be required for an IC design having fewer memory cells, to thereby reduce overall power consumption in the IC. In other embodiments, more robust sense amplifiers and precharge circuits may be required to improve yield for ICs having a large number of memory circuits compared to ICs having fewer memory circuits. Row drivers are a significant source of leakage power. Accordingly, ICs having a large number of row drivers may be optimized by employing row driver instances having reduced leakage current, as opposed to smaller or faster performance row drivers having higher leakage current that may otherwise be tolerated in memory circuits having fewer row drivers.

In accordance with an embodiment of the invention, a voltage adjustment circuit is preferably formed as a function of the total number of circuit instances (e.g., memory elements) within an IC. The voltage adjustment circuit provides a voltage that is coupled to at least a portion of a memory circuit during at least a portion of a memory cycle or for at least a portion of the time during which the memory circuit is operating. For example, an SRAM may have reduced voltage, which may be termed "standby voltage," applied to the memory cells therein when the SRAM is in standby mode; that is, the SRAM is retaining data but is neither reading nor writing. The fewer the memory cells within the IC, the lower the standby voltage can be while all the SRAM cells retain data. Thus a compiler used in forming the voltage adjustment circuit applies a reduced standby voltage to memory circuits within ICs having fewer memory cells and a higher standby voltage to memory circuits within ICs having a larger number of memory cells therein. A benefit of this approach is to reduce memory circuit power consumption, which thereby reduces overall IC power consumption, consistent with acceptable IC yield.

As indicated in FIG. 1 the voltage supplied to a memory circuit may be controlled to maintain functionality of all memory cells in the circuit as a function of the total number of memory cells. As illustrated by the exemplary memory circuit 200 depicted in FIG. 2, a voltage adjustment circuit 250 is preferably operative to apply the lowest required voltage to the memory circuit that is consistent with acceptable IC chip yield.

Figure 4:
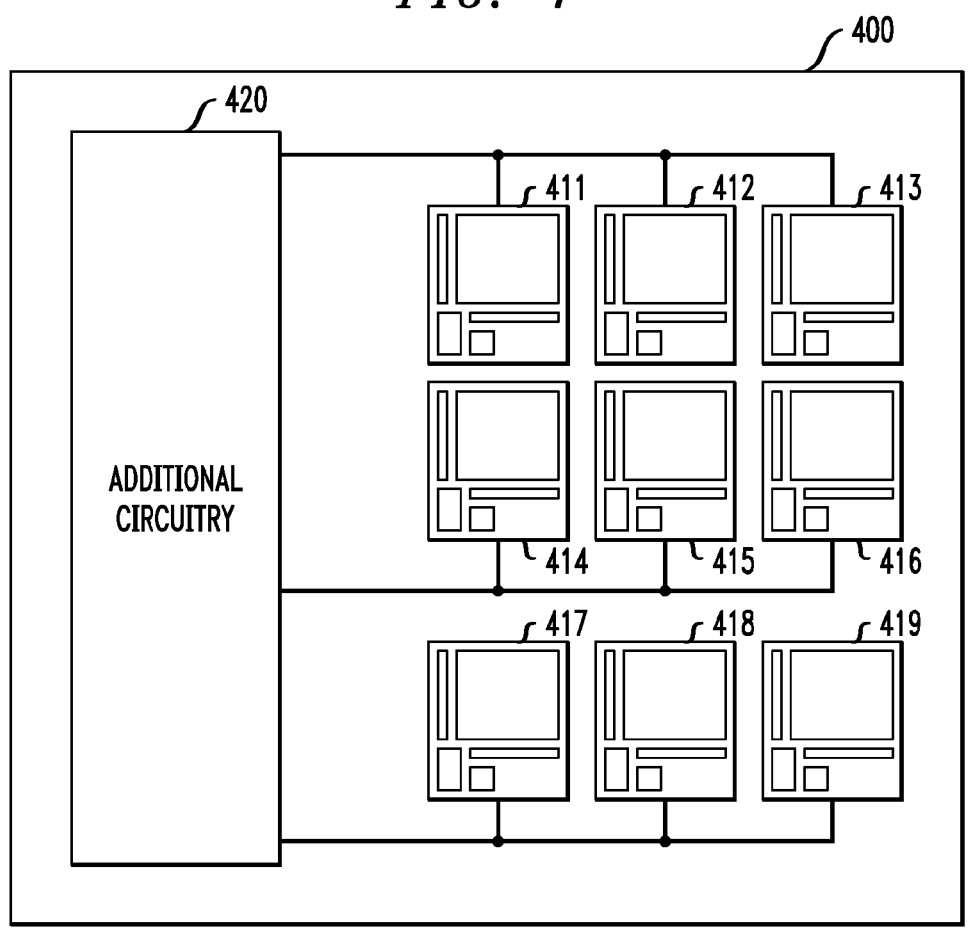
FIG. 4 illustrates an exemplary IC including a plurality of circuit instances, according to an embodiment of the present invention.

FIG. 4 illustrates an exemplary IC 400, according to an embodiment of the present invention. As apparent from the figure, IC 400 includes a plurality of memory instances 411, 412, 413, 414, 415, 416, 417, 418 and 419, and additional circuitry 420 coupled to the memory instances. Memory instances 411 through 419 need not be necessarily identical to one another, although identically formed memory instances are certainly contemplated by the invention. Moreover, one or more of the memory instances 411 through 419 may be implemented in a manner consistent with the illustrative memory circuit 200 shown in FIG. 2, although alternative memory architectures are similarly contemplated. The additional circuitry 420 is preferably operative to perform at least a portion of the functions of the IC 400. In one or more embodiments of the invention the additional circuitry 420 may comprise control circuitry, such as, for example, a processor, a digital (logic) circuit, an analog circuit, an application specific integrated circuit (ASIC), and/or a gate array.

At least a portion of the techniques of the present invention may be implemented in one or more ICs. In forming ICs, die are typically fabricated in a repeated pattern on a surface of a semiconductor wafer. Each of the die includes a device described herein, and may include other structures or circuits. Individual die are cut or diced from the wafer, then packaged as ICs. One skilled in the art would know how to dice wafers and package die to produce ICs. ICs so manufactured are considered part of this invention.

Figure 5:
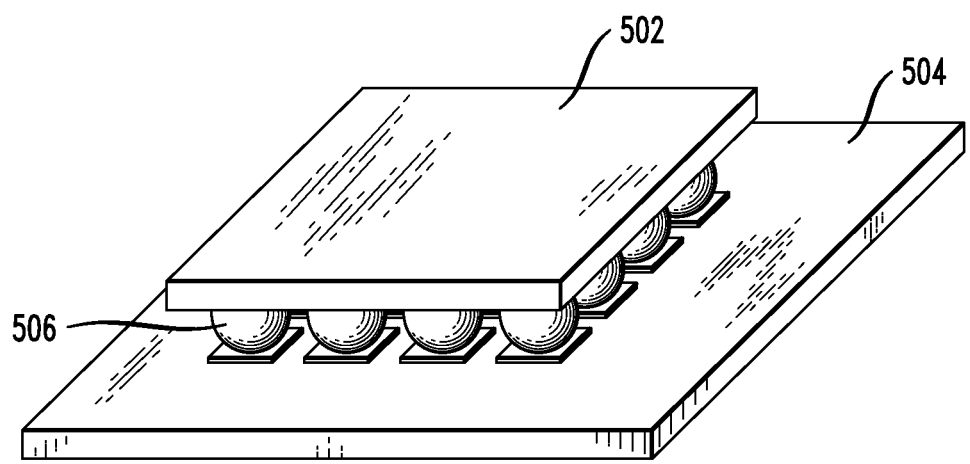
FIG. 5 is a perspective view depicting at least a portion of a semiconductor structure, formed according to an embodiment of the invention for implementing techniques of the present invention.

FIG. 5 is a perspective view depicting at least a portion of a semiconductor structure 500, formed according to an embodiment of the invention for implementing techniques of the present invention. The semiconductor structure 500 comprises a first IC die 502 and at least a second IC die 504 mechanically mounted proximate to and electrically interconnected with the first IC die, for example in a known manner. An illustrative embodiment of this application includes, but is not limited to, flip-chip and multi-chip module (MCM) technology.

The means of electrical interconnection contemplated by the invention is not limited and may include, for example, utilizing solder bumps, wire bonding, etc. As shown, the interconnection means used in semiconductor structure 500 includes a plurality of solder bumps 506, or alternative conductive structures, each solder bump being formed between a bonding site on the first IC die 502 and a corresponding bonding site on the second IC die 504.

By way of example only and without loss of generality, the first IC die 502 may include a processor (e.g., central processing unit (CPU), microprocessor, digital signal processor (DSP), etc.) and the second IC die 504 may include memory utilized by the processor. One or more of the IC die includes a memory circuit adapted for accessing weak memory cells therein without any significant degradation in performance of the memory circuit, according to techniques of the invention described herein. Semiconductor structures so manufactured are also considered part of this invention.

An IC and/or semiconductor structure formed in accordance with techniques of the present invention can be employed in essentially any application and/or electronic system which utilizes memory (e.g., embedded memory). Suitable systems for implementing the invention may include, but are not limited to, personal computers, communication networks, portable communications devices (e.g., cell phones), etc. Systems incorporating such ICs are considered part of this invention. Given the teachings of the invention provided herein, one of ordinary skill in the art will be able to contemplate other implementations and applications of the techniques of the invention.

Figure 6:
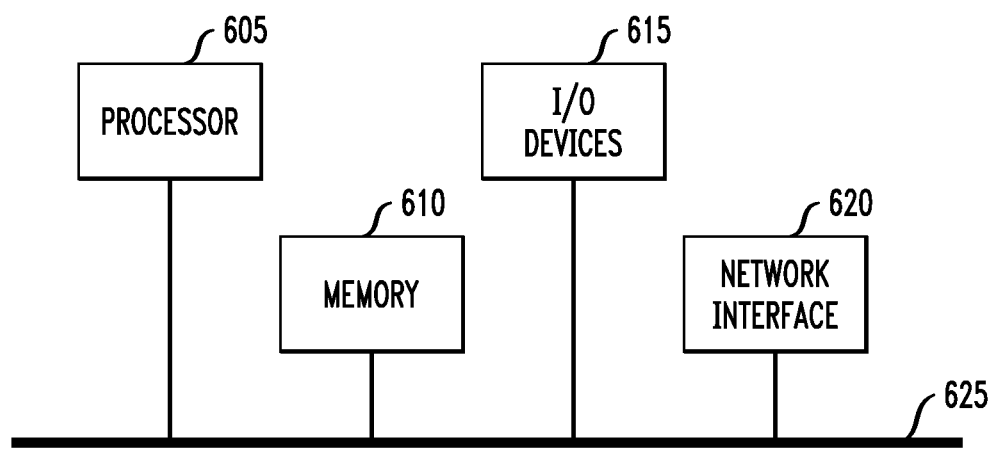
FIG. 6 illustrates at least a portion of an exemplary computer system in which techniques of the present invention may be implemented.

FIG. 6 illustrates at least a portion of an exemplary computer system 600 in which techniques of the present invention may be implemented. Computer system 600 includes a processor 605, memory 610, input/output (I/O) devices 615, and a network interface 620, coupled via a computer bus 625 or alternative connection arrangement.

It is to be appreciated that the term "processor" as used herein is intended to broadly include any processing device, such as, for example, one that includes a central processing unit (CPU) and/or other processing circuitry. It is also to be understood that the term "processor" may refer to more than one processing device, and that various elements associated with a processing device may be shared by other processing devices.

The term "memory" as used herein is intended to broadly include memory as may be associated with a processor or CPU, such as, for example, random access memory (RAM), ROM, a fixed memory device (e.g., hard disk drive), a removable memory device (e.g., diskette, compact disk, digital versatile disk (DVD) or flash memory module), flash memory, non-volatile memory, etc. The memory may be considered a computer readable storage medium.

In addition, the phrase "input/output devices" or "I/O devices" as used herein is intended to broadly include, for example, one or more input devices (e.g., keyboard, mouse, camera, etc.) for entering data to the processing unit, and/or one or more output devices (e.g., display, etc.) for presenting results (e.g., output data) associated with the processing unit.

Still further, the phrase "network interface" as used herein is intended to broadly include, for example, one or more transceivers or alternative communication devices to permit the computer system to communicate with another computer system via an appropriate communications protocol.

Accordingly, software components, including instructions or code for performing methodologies of the invention described herein (e.g., one or more software programs that are components of the memory compiler), may be stored in one or more of the associated memory devices (e.g., ROM, fixed or removable memory) and, when ready to be utilized, loaded in whole or in part (e.g., into RAM) and executed by a CPU.

In any case, it is to be appreciated that the techniques of the invention, described herein and shown in the appended figures, may be implemented in various forms of hardware, software, or combinations thereof, e.g., one or more operatively programmed general purpose digital computers with associated memory, implementation-specific ICs, functional circuitry, etc. Given the techniques of the invention provided herein, one of ordinary skill in the art will be able to contemplate other implementations of the techniques of the invention.

It is to be understood that individual components and/or steps of embodiments of the invention may be implemented on one such computer system or on more than one computer system, such as in a distributed manner. In the case of implementation on a distributed computing system, the distributed computer system may comprise one or more computer systems each implementing one or more aspects of the invention. The individual computer systems and/or components thereof may be connected via a suitable communication network, such as, for example, the Internet. Alternatively, the distributed computer system may be realized via one or more private and/or local area networks, such as, for example, an intranet. In any case, the invention is not limited to any particular computer architecture and/or network. Computer system 600 may represent one or more servers, or one or more other processing devices capable of performing all or a portion of the functions described herein.

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method for forming a first electronic circuit including a plurality of instances of a repeatable circuit element, the method comprising the steps of:
    obtaining a total number of instances of the repeatable circuit element in a design of an integrated circuit including the first electronic circuit and at least a second electronic circuit;
    configuring at least one functional parameter of the first electronic circuit as a function of the total number of instances of the repeatable circuit element in the integrated circuit to thereby satisfy a prescribed minimum composite manufacturing yield of the integrated circuit and at least one specification of the integrated circuit under prescribed operating conditions; and
    determining an interaction of the plurality of instances of the repeatable circuit element with one another in the design of the integrated circuit;
    wherein configuring the at least one functional parameter of the first electronic circuit comprises configuring said at least one functional parameter as a function of the interaction of the plurality of instances of the repeatable circuit element with one another; and
    wherein at least one of the obtaining, configuring and determining steps is performed by a processing device.

2. The method of claim 1, wherein
    configuring is performed to thereby satisfy the prescribed minimum composite manufacturing yield of the integrated circuit and the at least one specification of the integrated circuit under the prescribed operating conditions.

3. The method of claim 1, further comprising:
    determining a manner in which the plurality of instances of the repeatable circuit element are utilized in the integrated circuit; and
    configuring the at least one functional parameter of the first electronic circuit as a function of the manner in which the plurality of instances of the repeatable circuit element are utilized in the integrated circuit to thereby satisfy at least one of the prescribed minimum composite manufacturing yield of the integrated circuit and the at least one specification of the integrated circuit under the prescribed operating conditions.

4. The method of claim 1, wherein the at least one specification of the integrated circuit comprises at least one of a maximum power consumption specification and a timing specification.

5. The method of claim 4, further comprising the steps of:
    obtaining the maximum power consumption specification corresponding to the integrated circuit; and
    configuring the at least one functional parameter of the first electronic circuit so that total power consumption in the integrated circuit is less than or equal to the maximum power consumption specification.

6. The method of claim 5, wherein the step of configuring the at least one functional parameter of the first electronic circuit comprises controlling a voltage supplied to the first electronic circuit as a function of the total number of instances of the repeatable circuit element in the integrated circuit.

7. The method of claim 4, further comprising the steps of:
    obtaining the timing specification corresponding to the integrated circuit; and
    controlling timing in at least one signal path in the first electronic circuit as a function of the total number of instances of the repeatable circuit element in the integrated circuit so that timing in the integrated circuit is at least within a prescribed range of the timing specification.

8. The method of claim 1, wherein the repeatable circuit element comprises at least one of a memory cell, a sense amplifier, a memory column, a precharge circuit, a row driver and an output buffer.

9. The method of claim 1, wherein the integrated circuit is optimized for increased composite manufacturing yield under the prescribed operating conditions.

10. The method of claim 1, wherein the step of obtaining the total number of instances of the repeatable circuit element in the design of the integrated circuit comprises receiving a description of the first and at least second electronic circuits and summing a first number of instances of the repeatable circuit element in the first electronic circuit and at least a second number of instances of the repeatable circuit element in the at least second electronic circuit.

11. The method of claim 10, wherein the description of the first and at least second electronic circuits comprises a circuit description language representation of the first and at least second electronic circuits.

12. The method of claim 1, wherein the step of configuring at least one functional parameter of the first electronic circuit comprises adjusting a delay in one or more signal paths of one or more of the plurality of repeatable circuit elements to increase signal development time as a function of the total number of instances of the repeatable circuit element.

13. The method of claim 1, wherein the step of configuring at least one functional parameter of the first electronic circuit comprises skewing a timing of a memory function of a first one of the plurality of repeatable circuit elements with respect to a timing of a memory function of at least a second one of the plurality of repeatable circuit elements such that a current pulse of the first one of the plurality of repeatable circuit elements and a current pulse of at least the second one of the plurality of repeatable circuit elements do not superimpose one another.

14. The method of claim 1, wherein the step of configuring at least one functional parameter of the first electronic circuit comprises reducing a leakage current of one or more of the plurality of repeatable circuit elements as a function of the total number of instances of the repeatable circuit element, wherein each of the plurality of repeatable circuit elements comprises at least one row driver.

15. The method of claim 1, wherein the step of configuring at least one functional parameter of the first electronic circuit comprises forming a voltage adjustment circuit within the first electronic circuit, the voltage adjustment circuit adjusting a standby voltage of the first electronic circuit as a function of the total number of instances of the repeatable circuit element.

16. The method of claim 1, wherein the at least one functional parameter comprises at least one of: a timing in one or more signal paths of the plurality of repeatable circuit elements; a timing for a given memory function of the plurality of repeatable circuit elements; a leakage current of one or more of the plurality of repeatable circuit elements; and a standby voltage of one or more of the plurality of repeatable circuit elements.

17. An apparatus adapted to form a first electronic circuit including a plurality of instances of a repeatable circuit element, the apparatus comprising:
    memory; and
    at least one processor coupled to the memory and operative: (i) to receive a total number of instances of the repeatable circuit element in a design of an integrated circuit including the first electronic circuit and at least a second electronic circuit; (ii) to configure at least one functional parameter of the first electronic circuit as a function of the total number of instances of the repeatable circuit element in the design of the integrated circuit to thereby satisfy a prescribed minimum composite manufacturing yield of the integrated circuit and at least one specification of the integrated circuit under prescribed operating conditions; and (iii) to determine an interaction of the plurality of instances of the repeatable circuit element with one another in the design of the integrated circuit;
    wherein configuring the at least one functional parameter of the first electronic circuit comprises configuring said at least one functional parameter as a function of the interaction of the plurality of instances of the repeatable circuit element with one another.

18. The apparatus of claim 17, wherein the apparatus comprises a memory compiler and each of the first and at least second electronic circuits comprises a memory circuit including a plurality of instances of a memory element.

19. An integrated circuit, comprising:
    a plurality of electronic circuits, each of the electronic circuits including one or more instances of a repeatable circuit element; and
    a control circuit coupled to the plurality of electronic circuits, the control circuit being operative to control at least one functional parameter of at least a subset of the plurality of electronic circuits as a function of a total number of instances of the repeatable circuit element in the integrated circuit, and an interaction of the plurality of instances of the repeatable circuit element with one another in the integrated circuit;
    wherein the at least one functional parameter comprises at least one of: a leakage current of one or more of the plurality of repeatable circuit elements; and a standby voltage of one or more of the plurality of repeatable circuit elements.

20. The integrated circuit of claim 19, wherein the control circuit comprises a programmable voltage source operative to adjust a voltage supplied to at least the subset of the plurality of electronic circuits during at least a portion of time during which the integrated circuit is operated.

21. The integrated circuit of claim 20, wherein the programmable voltage source is operative to selectively turn off power to one or more of the plurality of electronic circuits as a function of at least one control signal.

22. The integrated circuit of claim 20, wherein the programmable voltage source is operative to generate a first output voltage having a first voltage level and at least a second output voltage having a second voltage level, the first output voltage being supplied to a first subset of the plurality of electronic circuits and the second output voltage being supplied to a second subset of the plurality of electronic circuits.

23. The integrated circuit of claim 19, wherein the integrated circuit comprises a control circuit operative to control at least one timing parameter of the subset of the plurality of instances of the repeatable circuit element.

24. The integrated circuit of claim 19, wherein the repeatable circuit element comprises a memory element.

25. An article of manufacture for forming a first electronic circuit including a plurality of instances of a repeatable circuit element, the article of manufacture comprising a computer-readable storage medium containing one or more programs which when executed implement steps of:
    obtaining a total number of instances of the repeatable circuit element in a design of an integrated circuit including the first electronic circuit and at least a second electronic circuit; and
    configuring at least one functional parameter of the first electronic circuit as a function of the total number of instances of the repeatable circuit element in the integrated circuit to thereby satisfy a prescribed minimum composite manufacturing yield of the integrated circuit and at least one specification of the integrated circuit under prescribed operating conditions; and
    determining an interaction of the plurality of instances of the repeatable circuit element with one another in the design of the integrated circuit;
    wherein configuring the at least one functional parameter of the first electronic circuit comprises configuring said at least one functional parameter as a function of the interaction of the plurality of instances of the repeatable circuit element with one another.

26. A semiconductor structure, comprising:
    a first integrated circuit die; and
    at least a second integrated circuit die mechanically mounted proximate to and electrically interconnected with the first integrated circuit die, at least one of the first and at least second integrated circuit die comprising:
    a plurality of electronic circuits, each of the electronic circuits including one or more instances of a repeatable circuit element; and
    a control circuit coupled to the plurality of electronic circuits, the control circuit being operative to control at least one functional parameter of at least a subset of the plurality of electronic circuits as a function of a total number of instances of the repeatable circuit element, and an interaction of the plurality of instances of the repeatable circuit element with one another in the semiconductor structure;
    wherein the at least one functional parameter comprises at least one of: a leakage current of one or more of the plurality of repeatable circuit elements; and a standby voltage of one or more of the plurality of repeatable circuit elements.

27. A method for forming a first electronic circuit including a plurality of instances of a repeatable circuit element, the method comprising the steps of:
- obtaining a total number of instances of the repeatable circuit element in a design of an integrated circuit including the first electronic circuit and at least a second electronic circuit; and
- configuring at least one functional parameter of the first electronic circuit as a function of the total number of instances of the repeatable circuit element in the integrated circuit to thereby satisfy at least one of a prescribed minimum composite manufacturing yield of the integrated circuit and at least one specification of the integrated circuit under prescribed operating conditions;
- wherein the step of obtaining the total number of instances of the repeatable circuit element in the design of the integrated circuit comprises receiving a description of the first and at least second electronic circuits and summing a first number of instances of the repeatable circuit element in the first electronic circuit and at least a second number of instances of the repeatable circuit element in the at least second electronic circuit;
- wherein the description of the first and at least second electronic circuits comprises a circuit description language representation of the first and at least second electronic circuits; and
- wherein at least one of the obtaining and configuring steps is performed by a processing device.

28. An apparatus adapted to form a first electronic circuit including a plurality of instances of a repeatable circuit element, the apparatus comprising:
- memory; and
- at least one processor coupled to the memory and operative: (i) to receive a total number of instances of the repeatable circuit element in a design of an integrated circuit including the first electronic circuit and at least a second electronic circuit; and (ii) to configure at least one functional parameter of the first electronic circuit as a function of the total number of instances of the repeatable circuit element in the design of the integrated circuit to thereby satisfy a prescribed minimum composite manufacturing yield of the integrated circuit and at least one specification of the integrated circuit under prescribed operating conditions;
- wherein the apparatus comprises a memory compiler and each of the first and at least second electronic circuits comprises a memory circuit including a plurality of instances of a memory element.

29. A method for forming a first electronic circuit including a plurality of instances of a repeatable circuit element, the method comprising the steps of:
- obtaining a total number of instances of the repeatable circuit element in a design of an integrated circuit including the first electronic circuit and at least a second electronic circuit; and
- configuring at least one functional parameter of the first electronic circuit as a function of the total number of instances of the repeatable circuit element in the integrated circuit to thereby satisfy a prescribed minimum composite manufacturing yield of the integrated circuit and at least one specification of the integrated circuit under prescribed operating conditions;
- wherein the step of configuring the at least one functional parameter of the first electronic circuit comprises reducing a leakage current of one or more of the plurality of repeatable circuit elements as a function of the total number of instances of the repeatable circuit element, wherein each of the plurality of repeatable circuit elements comprises at least one row driver; and
- wherein at least one of the obtaining and configuring steps is performed by a processing device.

30. A method for forming a first electronic circuit including a plurality of instances of a repeatable circuit element, the method comprising the steps of:
- obtaining a total number of instances of the repeatable circuit element in a design of an integrated circuit including the first electronic circuit and at least a second electronic circuit; and
- configuring at least one functional parameter of the first electronic circuit as a function of the total number of instances of the repeatable circuit element in the integrated circuit to thereby satisfy a prescribed minimum composite manufacturing yield of the integrated circuit and at least one specification of the integrated circuit under prescribed operating conditions;
- wherein the step of configuring at least one functional parameter of the first electronic circuit comprises forming a voltage adjustment circuit within the first electronic circuit, the voltage adjustment circuit adjusting a standby voltage of the first electronic circuit as a function of the total number of instances of the repeatable circuit element; and
- wherein at least one of the obtaining and configuring steps is performed by a processing device.

* * * * *